(12) United States Patent
Kim et al.

(10) Patent No.: US 7,387,943 B2
(45) Date of Patent: Jun. 17, 2008

(54) METHOD FOR FORMING LAYER FOR TRENCH ISOLATION STRUCTURE

(75) Inventors: Do-Hyung Kim, Seoul (KR); Sung-Eui Kim, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 166 days.

(21) Appl. No.: 10/083,756

(22) Filed: Feb. 25, 2002

(65) Prior Publication Data

US 2002/0117731 A1 Aug. 29, 2002

(30) Foreign Application Priority Data

Feb. 23, 2001 (KR) ................................ 2001-9382

(51) Int. Cl.
H01L 21/76 (2006.01)
H01L 21/31 (2006.01)
H01L 21/469 (2006.01)

(52) U.S. Cl. .................. 438/437; 438/424; 438/790; 438/794

(58) Field of Classification Search ........ 257/506–510, 257/513, 374; 438/207, 208, 218, 221, 225, 438/294, 296, 353, 362, 424, 425, 427, 435, 438/437, 439, 790, 794
See application file for complete search history.

(56) References Cited

U.S. PATENT DOCUMENTS

| | | | | |
|---|---|---|---|---|
| 4,510,670 A | * | 4/1985 | Schwabe et al. | 438/297 |
| 4,804,633 A | * | 2/1989 | Macelwee et al. | 438/16 |
| 5,665,633 A | * | 9/1997 | Meyer | 438/427 |
| 5,677,231 A | | 10/1997 | Maniar et al. | |
| 5,731,241 A | * | 3/1998 | Jang et al. | 438/424 |
| 5,837,612 A | * | 11/1998 | Ajuria et al. | 438/697 |
| 5,904,542 A | * | 5/1999 | Gilmer et al. | 438/439 |
| 5,923,998 A | * | 7/1999 | Liu | 438/526 |
| 5,994,201 A | * | 11/1999 | Lee | 438/427 |
| 6,074,917 A | * | 6/2000 | Chang et al. | 438/261 |
| 6,103,557 A | * | 8/2000 | Nakanishi | 438/158 |
| 6,110,793 A | * | 8/2000 | Lee et al. | 438/400 |
| 6,140,208 A | * | 10/2000 | Agahi et al. | 438/437 |
| 6,150,235 A | * | 11/2000 | Doong et al. | 438/424 |
| 6,159,821 A | * | 12/2000 | Cheng et al. | 438/424 |
| 6,165,869 A | * | 12/2000 | Qian et al. | 438/424 |
| 6,174,785 B1 | * | 1/2001 | Parekh et al. | 438/424 |
| 6,180,493 B1 | * | 1/2001 | Chu | 438/437 |

(Continued)

FOREIGN PATENT DOCUMENTS

JP 04-68564 * 4/1992 ................... 29/784

(Continued)

Primary Examiner—Shouxiang Hu
(74) Attorney, Agent, or Firm—Marger Johnson & McCollom, P.C.

(57) ABSTRACT

A method for forming a thermal oxide layer on the surface of a semiconductor substrate exposed during a semiconductor fabricating process. The thermal oxide layer is to be thin to minimize silicon substrate defects caused by volume expansion. A chemical vapor deposition (CVD) layer is then formed on the thin thermal oxide layer, creating a required thickness. The thin thermal oxide layer and the CVD material layer are formed in the same CVD apparatus. As a result, a process can be simplified and a particle-leading pollution can be prevented.

19 Claims, 10 Drawing Sheets

U.S. PATENT DOCUMENTS

| | | | |
|---|---|---|---|
| 6,221,736 B1 * | 4/2001 | Gau | 438/435 |
| 6,228,166 B1 * | 5/2001 | Suzuki et al. | 117/94 |
| 6,231,673 B1 * | 5/2001 | Maeda | 438/484 |
| 6,258,692 B1 * | 7/2001 | Chu et al. | 438/400 |
| 6,265,283 B1 * | 7/2001 | Nariman et al. | 438/424 |
| 6,285,073 B1 | 9/2001 | Cooper et al. | |
| 6,303,501 B1 * | 10/2001 | Chen et al. | 438/680 |
| 6,461,937 B1 | 10/2002 | Kim et al. | |
| 6,486,039 B2 | 11/2002 | Yoo et al. | |
| 6,613,647 B2 | 9/2003 | Kim | |
| 6,717,231 B2 | 4/2004 | Kim et al. | |
| 6,914,316 B2 | 7/2005 | Yun et al. | |
| 2001/0023120 A1 | 9/2001 | Tsunashima et al. | |
| 2001/0055842 A1 | 12/2001 | Uh et al. | |
| 2002/0117731 A1 | 8/2002 | Kim et al. | |
| 2002/0121661 A1 * | 9/2002 | Nakamura | 257/328 |

FOREIGN PATENT DOCUMENTS

| | | |
|---|---|---|
| KR | 1992-0020641 | 11/1992 |
| KR | 1997-0023849 | 5/1997 |

* cited by examiner

US 7,387,943 B2

METHOD FOR FORMING LAYER FOR TRENCH ISOLATION STRUCTURE

This application relies for priority upon Korean Patent Application No. 2001-09382, filed on Feb. 23, 2001, the contents of which are incorporated herein by reference in their entirety.

FIELD OF THE INVENTION

The present invention generally relates to the field of semiconductor device. More specifically, the present invention is directed to a method for forming a thermal oxide layer for a trench isolation structure in an integrated circuit device.

BACKGROUND OF THE INVENTION

Thermal oxidation is used for various semiconductor fabrication process steps such as forming isolation trench including forming a pad oxide layer and trench oxidation, or forming a thermal oxide layer which serves as a buffer during ion implantation. Thermal oxidation also includes an oxidation process after gate patterning, and includes an oxidation process for forming a capacitor dielectric layer. Thermal oxidation is typically performed in a furnace at a high temperature (800° C. to 1100° C.) of an oxidizing ambient, and can be classified into wet and dry thermal oxidation depending on the oxidizing ambient. During thermal oxidation, a silicon substrate is consumed (0.44 micrometer with respect to every 1 micrometer of growing thermal oxide layer) and a volume expansion occurs (2.2 times the consumed silicon). Such a volume expansion results in the formation of shallow pits in the silicon substrate because of excessive thermal oxidation after trench etching for device isolation.

Unfortunately, thermal oxidation is indispensable for semiconductor fabrication. For example, if thermal oxidation is not performed following gate patterning, the characteristics of a gate oxide layer can be degraded even if defects are not created in a semiconductor substrate. Further, during the formation of a shallow trench isolation ("STI") structure, if thermal oxidation is not performed following gate patterning, junction leakage currents ($N^+/P$ leakage currents) can increase.

FIG. 11 shows the distribution of cumulative junction leakage currents with and/without thermal oxidation. In FIG. 11, a P-type substrate is grounded and a voltage of 2.5V is applied to an $N^+$ area ($10^{15}$ atoms/cm$^2$). As shown, the characteristics of leakage currents without oxidation was poor as compared to that of leakage currents with oxidation. FIG. 12 shows the degradation of a gate oxide layer without the thermal oxidation process. As can be seen, the gate oxide layer is thinner at the edge of an active region than at other regions.

It is ideal that thermal oxidation proceed with minimal thickness and the silicon substrate be conserved to reduce stress resulting from volume expansion. By contrast, a thicker thermal oxide layer is typically required following the formation of a trench in a substrate. If the thermal oxide layer is not sufficiently thick, a tunneling phenomenon might occur. That is, when a nitride liner is formed in the following process, such a thin thermal oxide layer deteriorates the device characteristics. In other words, impurities are generated from defects at the interfaces between the nitride liner and the thermal oxide layer, or within the thermal oxide layer itself, and they are diffused into a silicon substrate (i.e., trench upper edge) through the thermal oxide layer ("tunneling phenomenon"), degrading device characteristics. Therefore, the thermal oxide layer during the STI technique must have a sufficient thickness to trap the impurities.

In the STI technique, a profile of the trench upper edge is changed according to the degree of thermal oxidation because the amount of consumed silicon is variable to the thickness of the thermal oxide layer. That is, the greater the thickness of the thermal oxide layer is, the worse the profile of the trench upper edge. A thick thermal oxide layer of, for example, 200 Å is formed to prevent impurities from penetrating a trench. As shown in FIG. 13, the profile of the trench upper edge becomes sharp and a gate oxide layer becomes thinner at the edge than at other regions, which makes it hard to form a conformal gate oxide layer. Accordingly, the reliability of the gate oxide layer cannot be ensured. If a strong electric field is applied, the gate oxide layer can be broken down.

In another approach, a thin thermal oxide layer of, for example, 100 Å is formed in the trench so as to reduce consumption of the silicon substrate. As shown in FIG. 14, the profile of the trench upper edge is rounded, which makes it possible to prevent a gate oxide layer from being formed too thinly. As mentioned above, if a nitride liner is formed in the following process, impurities can penetrate a silicon substrate. This is because such a thin thermal oxide layer cannot sufficiently trap the impurities.

For this reason, in the trench isolation technique, a thermal oxide layer formed on a trench sidewall must have a sufficient thickness to trap the impurities.

Therefore, it is inevitable that a semiconductor substrate suffer from defects created by the volume expansion because a thermal oxide layer has to be formed having a sufficient thickness.

SUMMARY OF THE INVENTION

The present invention provides a method of forming an oxide layer to a required thickness by a composite layer of a thin thermal oxide layer and a CVD oxide layer. CVD oxide layer can be replaced by suitable insulating layer.

The present invention also provides a trench isolation structure and a method for fabricating the same.

According to an aspect of the present invention for forming a required thickness of an oxide layer, a thermal oxide layer is formed on a silicon substrate as thin as possible for minimal consumption of the silicon substrate and a CVD oxide layer is formed on the thin thermal oxide layer to meet the required oxide thickness. The present invention provides a double layer structure of thermal oxide layer and CVD oxide layer as compared with conventional single layer of thermal oxide layer. Therefore, the consumption of the silicon substrate during thermal oxidation can be minimized, minimizing volume expansion.

Preferably, thermal oxidation can be carried out in a furnace. More preferably, thermal oxidation can be carried out in the CVD apparatus. Thermal oxide and CVD oxide are formed in the same CVD apparatus without exposing the substrate in the air, thereby preventing contamination by fine airborne particles. Depending on the fabrication process, a further insulating layer can be formed on the CVD oxide layer in the same CVD apparatus.

More particularly, when a thermal oxide layer is formed in the CVD apparatus, O2, N2O or combination thereof are used as an oxygen source at a temperature of about 750-1000° C. under about 1 torr. Continuously, the temperature is reduced to about 700-850° C. and the atmosphere is reduced to about 0.5 torr and N2O and SiH4 are supplied as a source gas to form the CVD oxide layer. During this CVD oxide process, the silicon substrate is not consumed.

According to one embodiment, if an insulating layer is formed on the thermal oxide layer instead of the CVD oxide layer, source gas and temperature conditions are to be changed in the same CVD apparatus. For example, if a thermal oxide layer and an aluminum trioxide layer are sequentially formed in the CVD apparatus, $Al(CH_3)_3$ and $H_2O$ can be used as a source gas. If a tantalum pentoxide layer is formed on the thermal oxide layer, $Ta(OC_2H_5)_5$ and $O_2$ can be used as a source gas.

According to another aspect of the present invention, there is provided a method of forming an oxide layer in an integrated circuit device process. The method includes forming a thermal oxide layer on an exposed semiconductor substrate such as a single crystalline silicon substrate in a chemical vapor deposition (CVD) apparatus, and forming a CVD oxide layer on the thermal oxide layer in the CVD apparatus.

According to still another aspect of the present invention, there is provided a method of forming a layer in an integrated circuit device. The method includes forming a thermal oxide layer in a trench formed by etching a single crystalline silicon substrate, forming a conformal liner material layer on the thermal oxide layer, and forming a nitride liner layer on the conformal liner material layer. The thermal oxide layer is formed to a thickness of 20 Å to 100 Å, and the liner material layer is formed to a thickness of 50 Å to 400 Å. The liner material layer is made of one selected from the group consisting of oxide, aluminum trioxide, zirconium oxide, and tantalum pentoxide. The thermal oxide layer, the liner material layer, and the nitride liner layer are formed in the same chemical vapor deposition (CVD) apparatus. The thermal oxide layer is formed using $O_2$, $N_2O$ or a combination thereof as a source gas at a temperature of 750° C. to 1000° C., and the liner material layer is a high temperature oxide layer formed using $N_2O$ and $SiH_4$ as a source gas at a temperature of 700° C. to 850° C.

In one embodiment, a nitride liner layer is formed on the CVD material layer in the CVD apparatus to a thickness of approximately 30 Å to 100 Å. A trench filling layer is then formed on the nitride liner layer in the CVD apparatus to a thickness of approximately 3000 Å to 10000 Å.

DESCRIPTION OF THE PREFERRED EMBODIMENT

In order to solve the above-mentioned problems encountered in the prior art, the present invention employs a dual layer of a thermal oxide layer and a CVD oxide layer (or other insulating layer) formed thereon.

Figure 1:
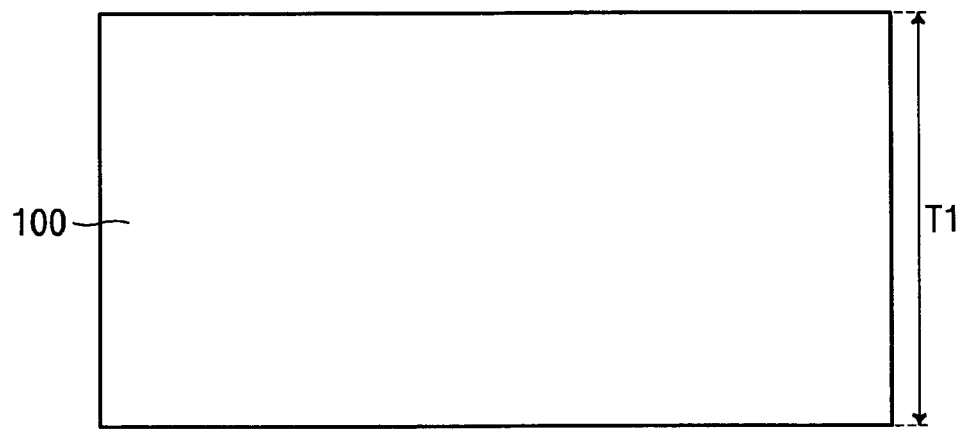
FIG. 1 is a cross-sectional view showing a part of a semiconductor substrate according to the present invention.

FIG. 1 illustrates a cross-sectional view of a semiconductor substrate, for example, single crystalline silicon substrate 100 having a thickness of 'T1'. The silicon substrate 100 may be an exposed single crystalline substrate prior to formation of a thermal oxide layer in various semiconductor fabrication processes, for example: a single crystalline silicon substrate prior to formation of a pad oxide layer (thermal oxide layer); a single crystalline silicon substrate following device isolation and prior to formation of a thermal oxide layer acting as an ion-implanting buffer layer; a single crystalline silicon substrate prior to the formation of a gate dielectric layer, and a single crystalline silicon substrate following gate etching and prior to a thermal oxidation process. A person skilled in the art will appreciate that other suitable semiconductor substrates can be used in place of a single crystalline silicon substrate depending on applications.

Figure 10:
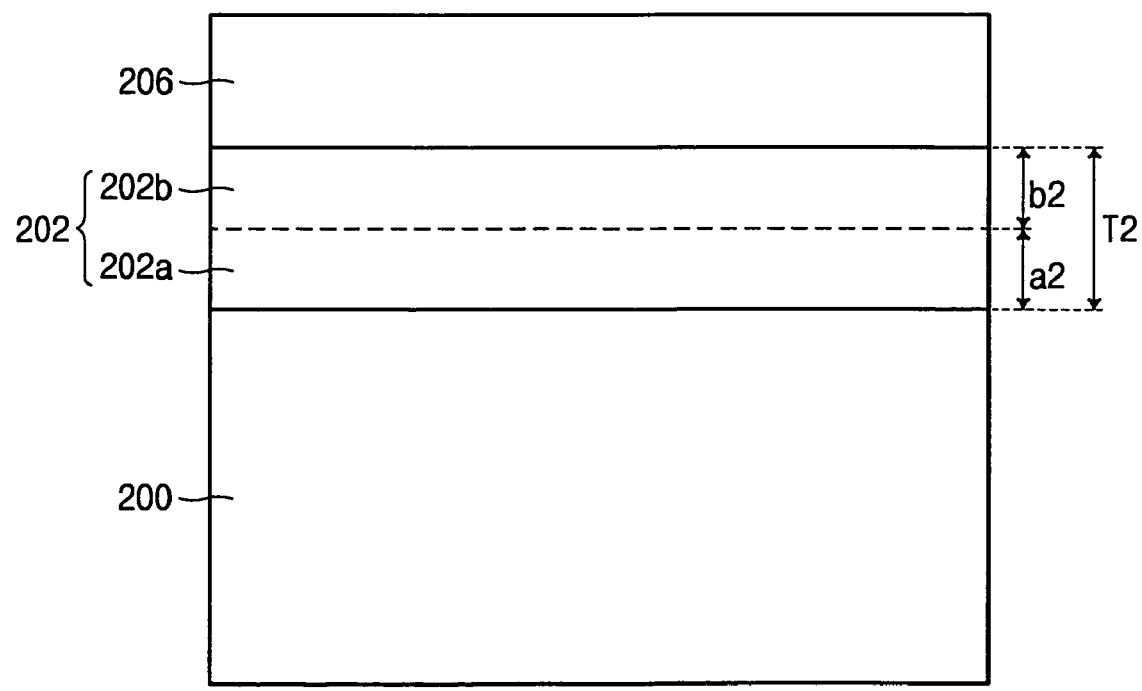
FIG. 10 is a cross-sectional view showing a semiconductor substrate on which a thermal oxide layer 202 is formed according to a prior art.
Figure 11:
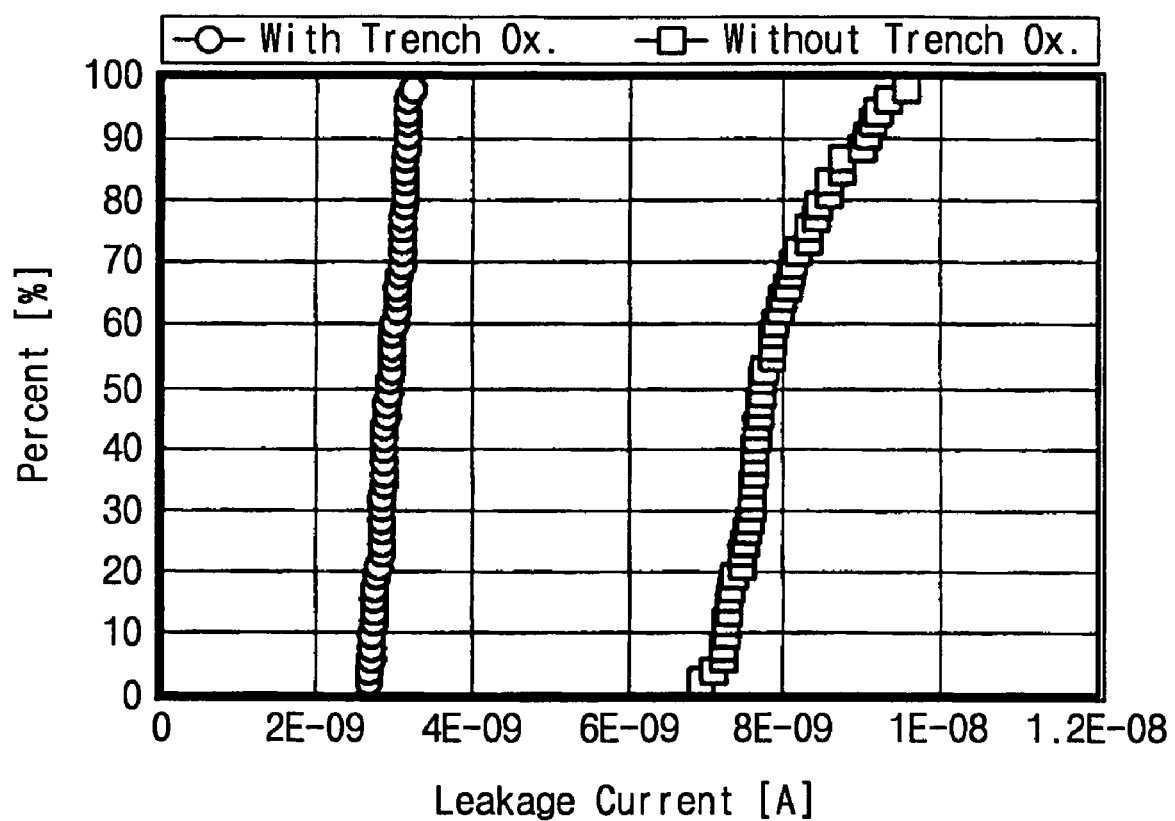
FIG. 11 is a graph showing the distribution of a cumulative leakage current with/without a thermal oxidation process after forming a trench.
Figure 12:
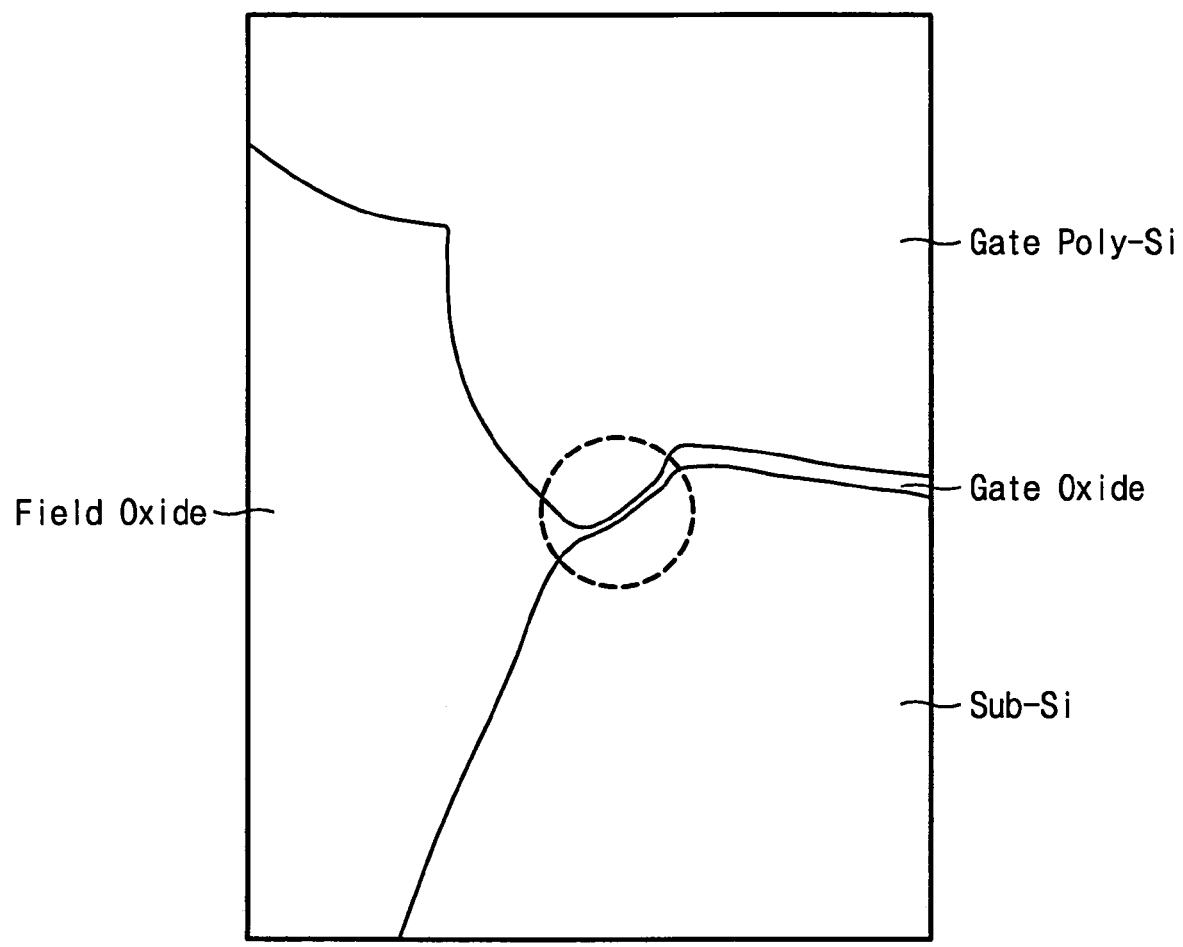
FIG. 12 is a cross-sectional view for explaining the fact that characteristics of a gate oxide layer are deteriorated without a thermal oxidation process after forming a trench.
Figure 13:
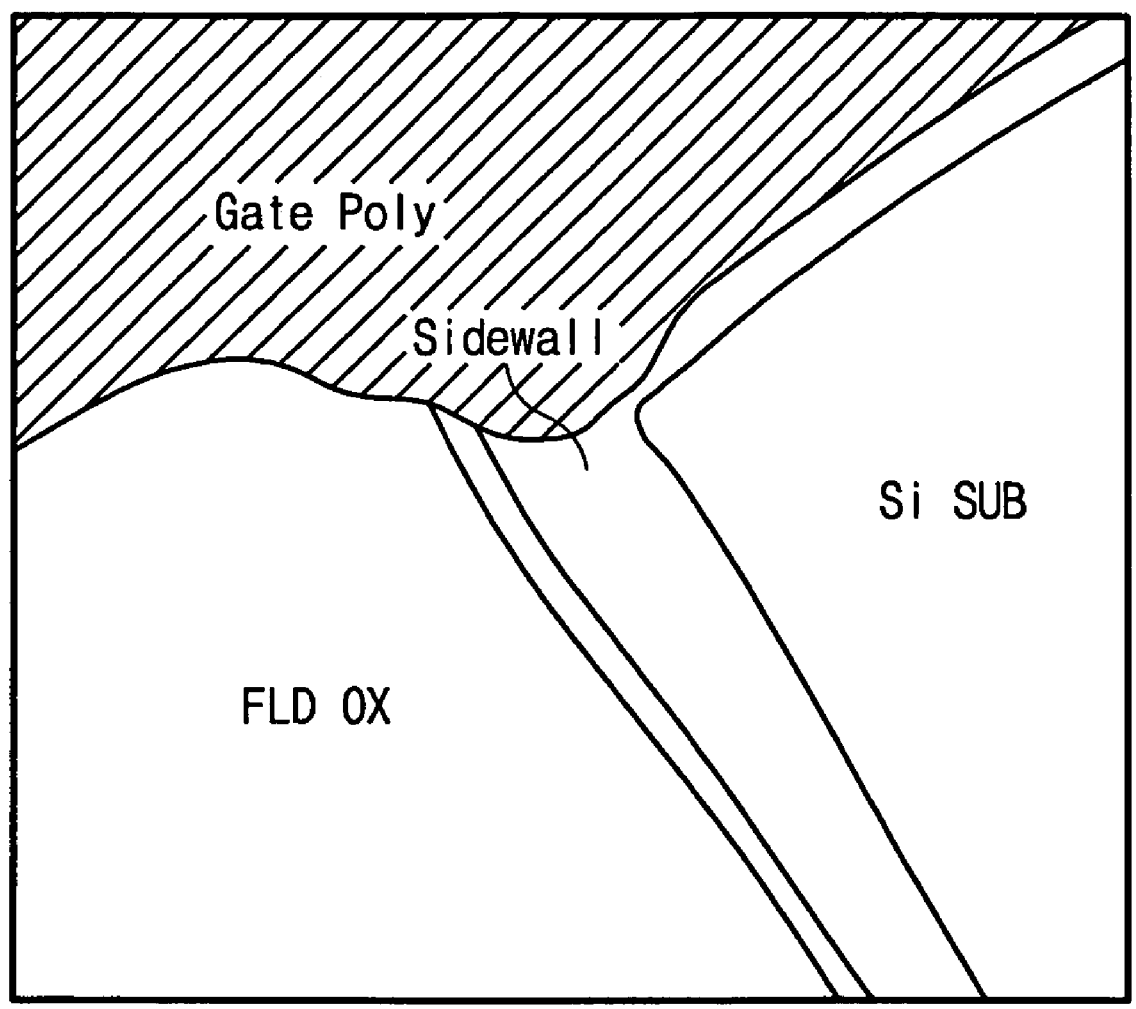
FIG. 13 and FIG. 14 are cross-sectional views showing a trench isolation structure when thermal oxide layers of 200 Å and 100 Å are formed after forming a trench.
Figure 14:
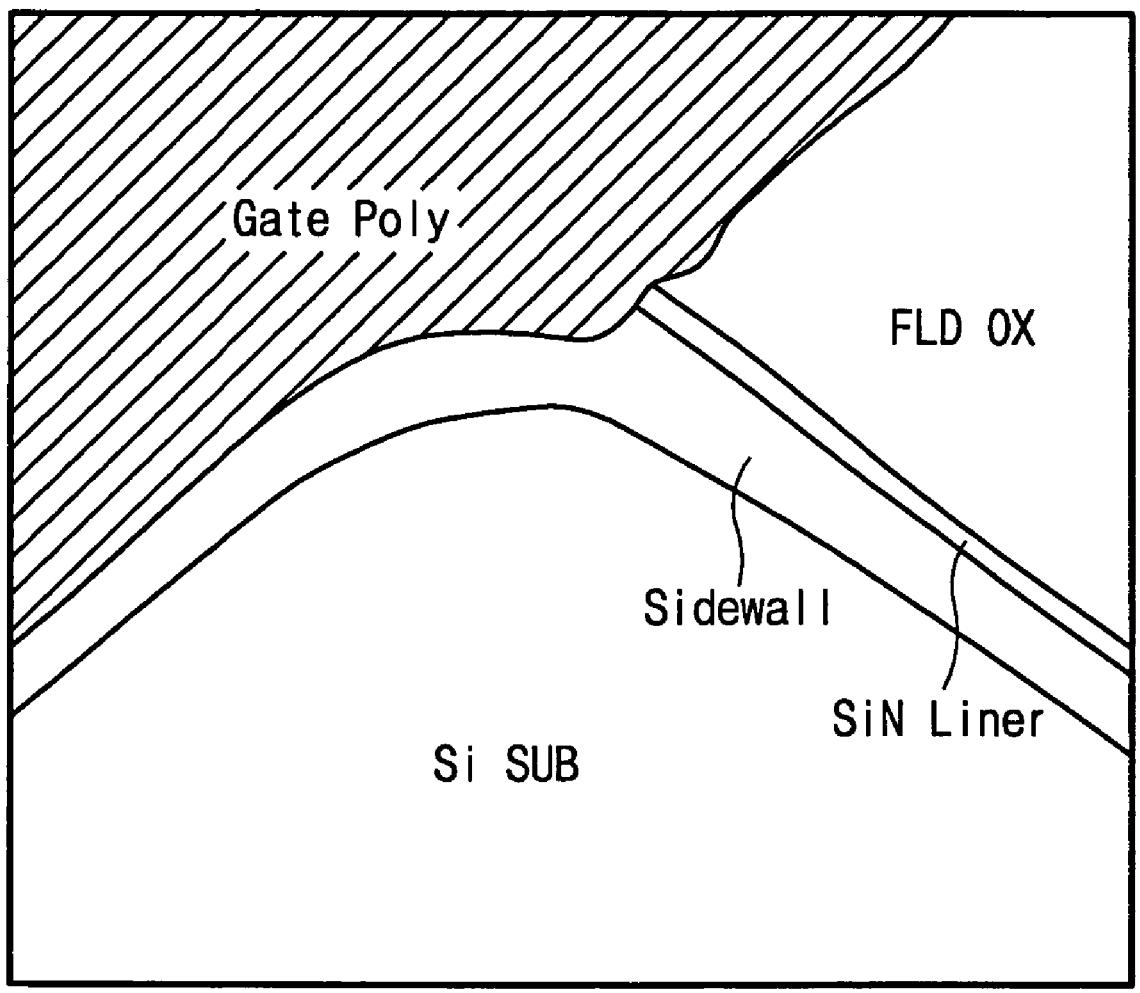

If a thermal oxide layer is formed having a desired thickness of 'T2' (FIG. 3) on a surface of the exposed substrate 100, it is conventionally formed of only thermal oxide 202 (FIG. 10). The single crystalline silicon substrate is as consumed as 'a2' (202a). See FIG. 10.

Figure 2:
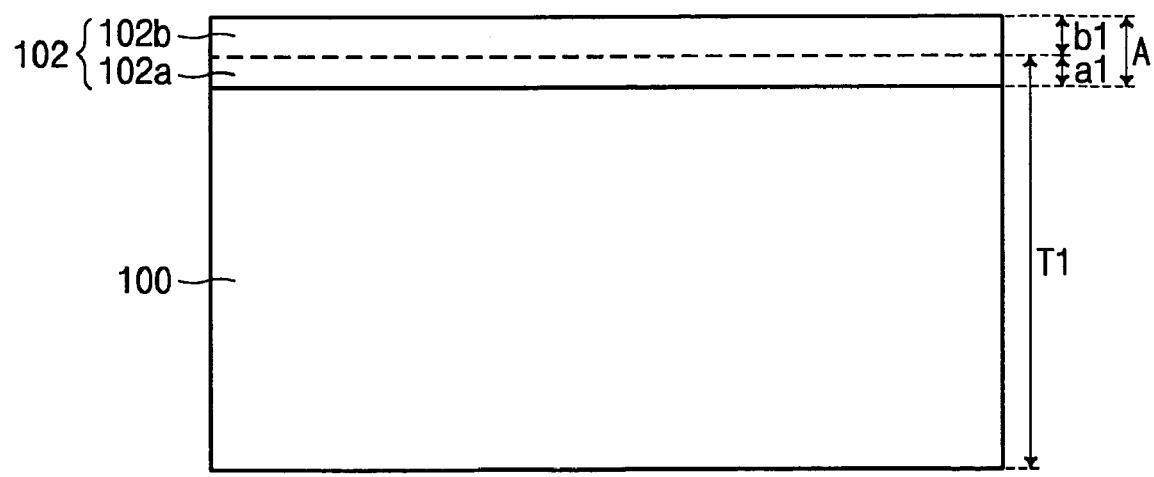
FIG. 2 is a cross-sectional view showing a semiconductor substrate on which a thermal oxide layer 102 is formed.

According to an embodiment of the present invention, a thermal oxide layer 102 is formed thinly as possible to a thickness ('A' represented in the drawing). In this case, the silicon substrate 100 is as consumed as 'a1' (see FIG. 2). Then, a CVD insulating (material) layer 104 is formed to a thickness of 'C' using conventional CVD techniques (see FIG. 3). Thus, a dual layer 105 of the thermal oxide layer 102 and the insulating layer 104 are formed to the desired thickness of 'T2'. Although the CVD insulating layer 104 is preferably made of silicon oxide, it may be made of other oxides, for example, aluminum oxide such as aluminum trioxide, tantalum oxide such as tantalum pentoxide or zirconium oxide.

Figure 3:
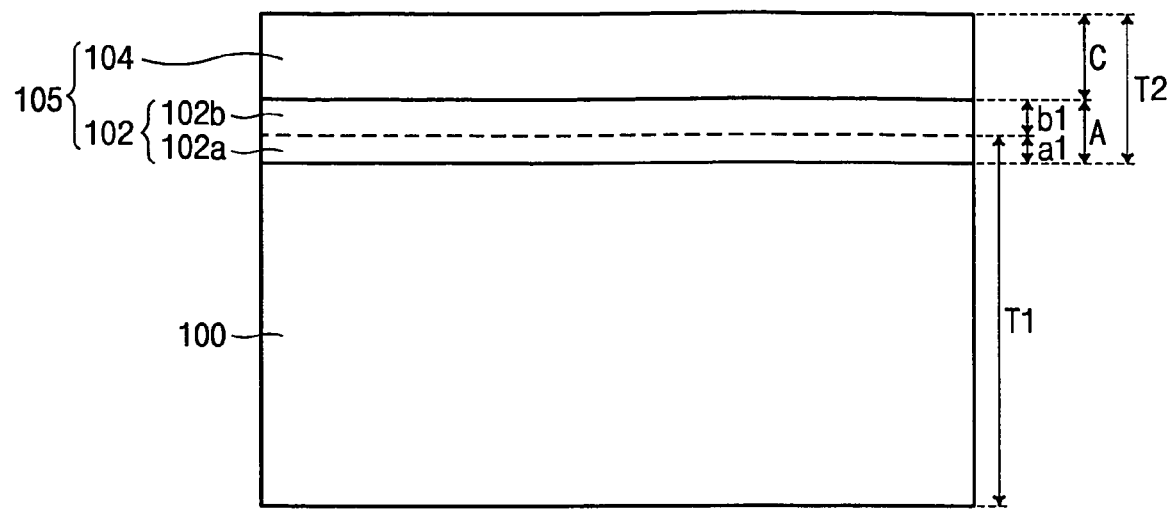
FIG. 3 is a cross-sectional view showing a semiconductor substrate where a chemical vapor deposition (CVD) insulating layer 104 is formed on the thermal oxide layer 102.

Comparing FIG. 3 with FIG. 10, the thickness of the silicon consumption 'a1' of the present invention is far smaller than that 'a2' of the conventional art. Therefore, the present invention results in less consumption of the silicon substrate 100.

Conventionally, if a thermal oxide layer is formed to a thickness of 100 Å, the thickness of a single crystalline silicon substrate consumed is 44 Å. Namely, a thermal oxide layer formed by the substrate consumption is 44 Å.

In contrast, in the present invention, if a thermal oxide layer is formed to a thickness of 100 Å (a thermal oxide layer of 10 Å and a CVD insulating layer of 90 Å), the thickness of a single crystalline silicon substrate consumed is 4.4 Å. The result is a ten-fold reduction in the consumption of the substrate. Namely, a thermal oxide layer formed by the silicon substrate consumption is 4.4 Å.

Figure 4:
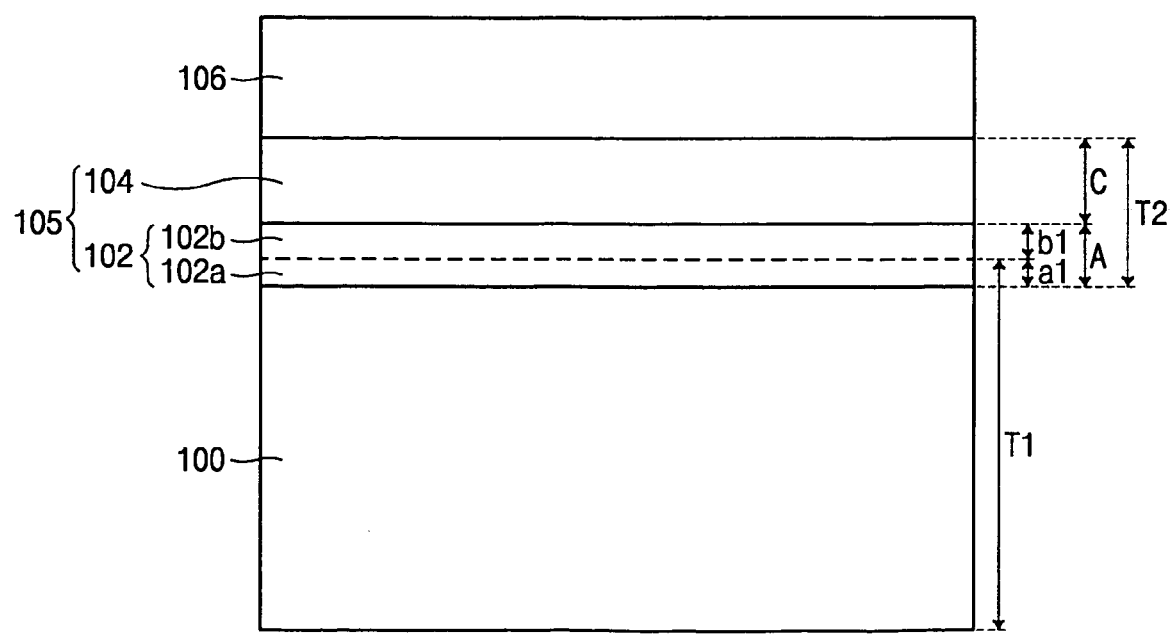
FIG. 4 is a cross-sectional view showing a semiconductor substrate where another CVD insulating layer 106 is formed on the CVD insulating layer 104.

Referring to FIG. 4, another CVD deposition layer 106 is formed on the CVD insulating layer 104. The deposition layer 106 can be either an insulating layer or a conductive layer.

The thermal oxide layer 102 is conventionally formed in a furnace. A thermal oxidation condition is one where temperature and pressure are suitably adjusted according to the thickness of layers, for example, at a temperature range of 800° C. to 950° C. Preferably, the thermal oxide layer 102 is formed in a CVD apparatus where the CVD insulating layer 104 is to be formed. That is, these layers are preferably formed in the same apparatus. Therefore, a single crystalline silicon substrate is not exposed to air and gas, and temperature and pressure are easily adjusted to form a thermal oxide layer and a CVD insulating layer.

When CVD techniques are used to form a thermal oxide layer in accordance with one embodiment of the present invention, process temperature and pressure are preferably higher than in a conventional CVD process, and only an oxygen source gas is used without a silicon source gas. If a CVD insulating layer is formed following formation of the thermal oxide layer, it is necessary to add the silicon source gas and to adjust temperature and pressure.

Specifically, the thermal oxide layer 102 can be formed in the CVD apparatus using $O_2$, $N_2O$ or a combination thereof as a source gas at a temperature of 750° C. to 1000° C. and at a pressure of 1 Torr and higher (e.g., atmospheric pressure at 1 Torr to room pressure). By lowering temperature and pressure and changing a reaction gas (i.e., using $SiH_4$ as a silicon source and $N_2O$ as an oxygen source), a CVD silicon oxide layer forms on the thermal oxide layer at a temperature of 700° C. to 850° C. and at a pressure of 0.5 Torr to 1 Torr.

If another insulating layer, not the CVD silicon oxide layer, is formed on the thermal oxide layer 102, a different source gas and process temperature in the same CVD apparatus are required. For example, if an aluminum oxide layer is formed, $Al(CH_3)_3$ and $H_2O$ can be used as source gases. If a tantalum oxide layer is formed, $Ta(OC_2H_5)_5$ and $O_2$ can be used as source gases.

The CVD layer 106 formed on the CVD silicon oxide layer 104 is preferably made of oxide, nitride or polysilicon. The process continuously proceeds in the same CVD apparatus.

Figure 5:
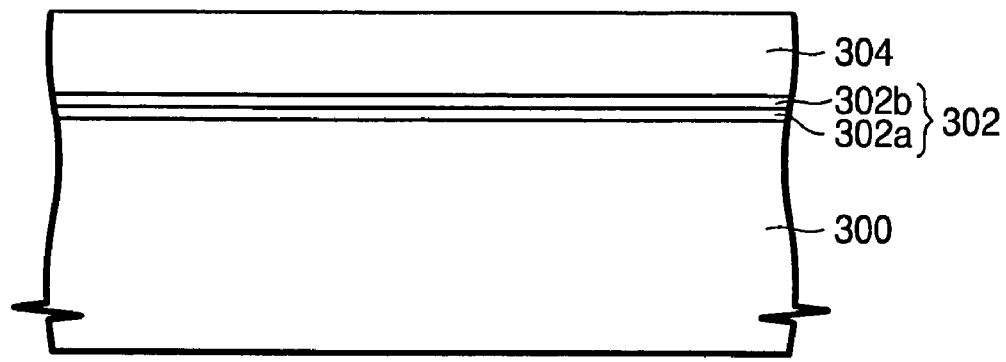
FIG. 5 to FIG. 9 are cross-sectional views showing the steps of forming a trench isolation according to the present invention.

A method of forming an isolation trench will now be described hereinafter with reference to FIG. 5 to FIG. 9. This is different from the above embodiment of FIG. 1 to FIG. 4 in that a single crystalline silicon substrate is etched to a predetermined depth. Referring to FIG. 5, a pad oxide layer 302 is formed on a single crystalline silicon substrate 300. The pad oxide layer 302 may be a dual layer comprising thermal oxide 302a and CVD oxide 302b formed by the method as described above. The thermal oxide 302a can be preferably formed either in a furnace, or in a CVD apparatus. That is, the thermal oxide 302a and the CVD oxide 302b are formed in the same CVD apparatus.

A silicon nitride layer 304 as a mask is formed on the pad oxide layer 302. In this case, the silicon nitride layer 304 is formed by CVD techniques in the same CVD apparatus for forming the pad oxide layer 302. That is, the silicon nitride layer 304 is formed in-situ following formation of the pad oxide layer 302.

Figure 6:
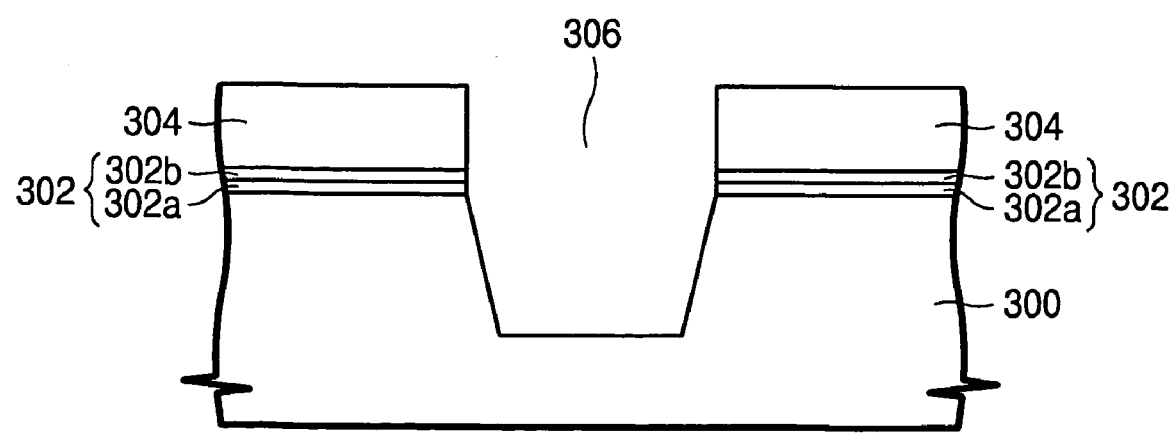
Figure 7:
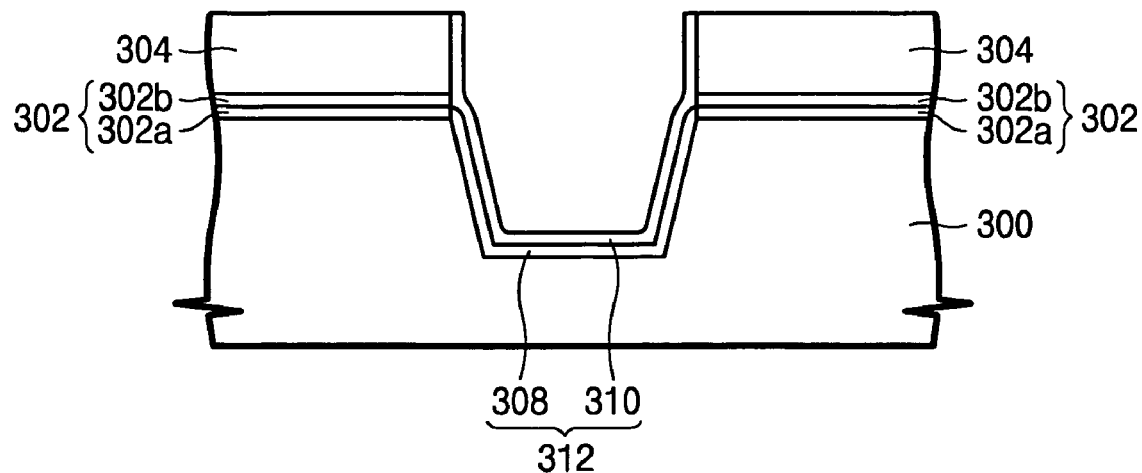

Referring to FIG. 6, the silicon nitride layer 304, the pad oxide layer 302, and the silicon substrate 300 are patterned by photolithography and etching to form a trench 306.

Thermal oxidation is carried out in order to cure etching damages to the silicon substrate 300. Preferably, the thermal oxidation produces a thin thermal oxide layer 308 to a thickness of 20 Å to 100 Å. Such a thin thermal oxide layer is formed to minimize the amount of a single crystalline silicon substrate consumed. The profile of the trench upper edge is also improved to prevent a gate insulating layer from being too thinly formed. A CVD insulating layer (i.e., liner material layer) 310 is formed on the thermal oxide layer 308, completing a dual layer 312 comprising the thermal oxide 308 and the CVD insulating layer 310. Conventionally, both a CVD insulating layer and a thermal oxide layer are each made of thermal oxide, i.e., they make up a single layer. The thickness of the liner insulating layer 310 must be thick enough to prevent penetration of impurities that may be generated through the formation of a nitride liner layer thereon, together with the already-formed thin thermal oxide layer 308. For example, the thickness of the liner insulating layer 310 is 50 Å to 400 Å. Therefore, a thermal oxide layer can be minimally formed.

Thus, with the present invention, volume expansion and physical and thermal stress can be substantially reduced, while impurities are prevented from penetrating into a silicon substrate.

Preferably, the thermal oxide layer 308 is formed in a CVD apparatus. That is, the thermal oxide layer 308 and the CVD insulating layer 310 are formed in situ in the same CVD apparatus to prevent contamination to the crystalline silicon substrate. More preferably, the CVD insulating layer 310 is made of CVD oxide. In this case, an oxygen source gas flow to form a thermal oxide layer prior to formation of a CVD oxide layer, and process temperature and pressure conditions are changed to flow a silicon source gas additionally. This results in the simplified formation of the CVD oxide layer.

Formation of the thermal oxide layer 308 in the CVD apparatus is carried out using $O_2$, $N_2O$ or combination thereof as an oxygen source gas at a temperature of 750° C. to 1000° C. at atmospheric pressure of 1 Torr.

As mentioned above, the thermal oxide layer 308 must be thin, for example, 20 Å to 100 Å to result in a crystalline silicon substrate consumption of 8.8 Å to 44 Å.

In one embodiment, when a thermal oxide layer of 30 Å is formed in a CVD oxide layer, its process can be carried out using oxygen of 30000 sccm (flow rate) at a temperature of 850° C. for 15 minutes. Alternatively, the thermal oxide layer can be formed using $N_2O$ of 3000 sccm (flow rate) at a temperature of 850° C. for 8 minutes.

In the same CVD apparatus, the CVD liner insulating layer 310 is formed by changing the source gas, and changing the process temperature and pressure conditions, i.e., lowering the process temperature and pressure. If the CVD insulating layer 310 is made of silicon oxide, $SiH_4$ as a silicon source gas and $N_2O$ as an oxygen source gas are used at a temperature of 700° C. to 850° C. and at a pressure of 0.5 Torr to 1 Torr. The thickness of the CVD oxide layer is based upon that of the thermal oxide layer 308, and is adjusted so as to prevent impurity penetration together with the thermal oxide layer 308. For example, the CVD oxide layer is formed to a thickness of 50 Å to 400 Å.

Alternatively, other insulating layers can replace the CVD oxide layer. These insulating layers preferably have an etching selectivity with respect to a nitride liner formed in the following process. The insulating layer can be made of aluminum trioxide ($Al_2O_3$), tantalum pentoxide ($Ta_2O_5$) or zirconium oxide. The aluminum trioxide layer is formed using $Al(CH_3)_3$ of 150 sccm and $H_2O$ of 150 sccm as source gas at a temperature of 350° C. and at a pressure of 0.5 Torr. The tantalum pentoxide layer is formed using $Ta_2(OC_2H_5)_5$ and $O_2$ as source gas.

Figure 8:
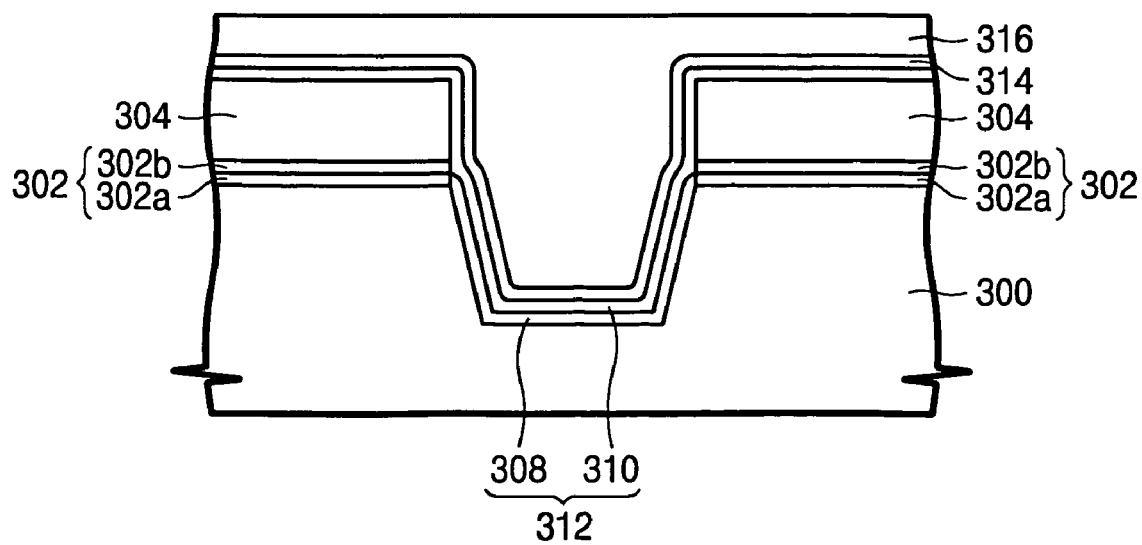

Referring to FIG. 8, a nitride liner layer 314 is formed on the CVD insulating layer 310 to a thickness of 30 Å to 100 Å. The nitride liner layer 314 is also formed in the same CVD apparatus. The nitride liner layer 314 blocks oxidation of an etched single crystalline silicon substrate and alleviates a stress applied to the inner wall of a trench. In the same CVD apparatus, a trench isolation material layer 316 fills up the trench 306. The material layer 316 is an insulating layer made of, for example, borophosphosilicate glass (BPSG) or high-density plasma (HDP) oxide. If the material layer 316 is made of HDP oxide, a middle temperature oxide layer is preferably formed on the nitride liner layer 314 in order to protect the nitride liner layer 314.

Figure 9:
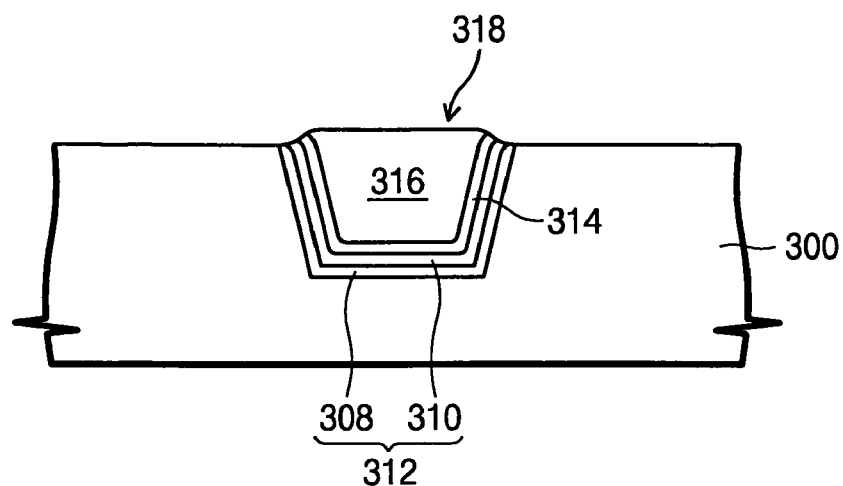

Conventionally, a planarization process and a phosphoric acid strip process are carried out to complete a trench isolation structure 318, as shown in FIG. 9. A CVD liner insulating layer 310 is interposed between a nitride liner layer 314 and a silicon nitride layer 304 for a mask. This enables an exposed area of the nitride liner layer 314 to be minimal while removing a mask of the silicon nitride layer 304. As a result, a dent phenomenon can be minimized.

As the following process, a gate electrode forming process and an ion implantation process are carried out to form source and drain regions. Thus, a transistor is completed.

Figure 15:
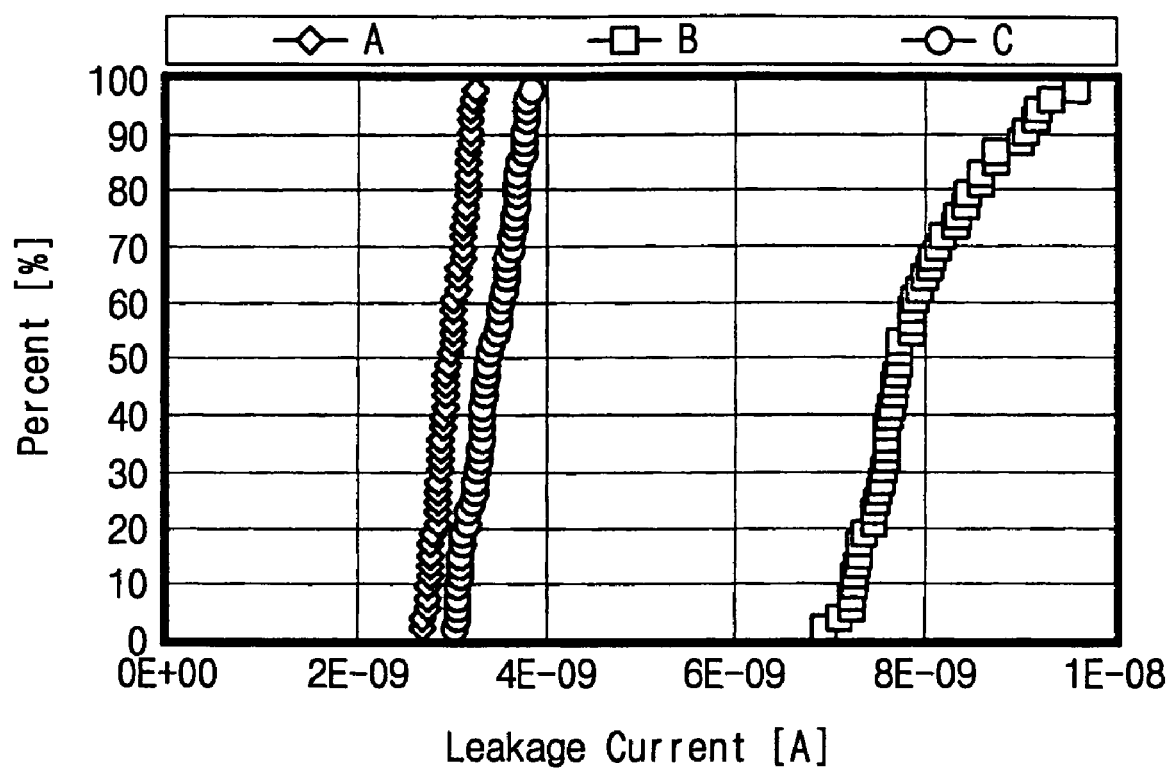
FIG. 15 is a graph showing the effects of the present invention.

Referring to FIG. 15, a graph shows the effects of the present invention. The horizontal axis represents an $N^+/P$ junction leakage current (in amperes), and the vertical axis represents a distribution to each sample (in percentages). The current and distribution are measured under the state that a P-type semiconductor substrate is grounded and 2.5V is applied to an $N^+$ area (about $10^{15}$ atoms/cm$^2$). In the graph, "-◇-A" is where an oxide layer[s] formed prior to deposition of a trench material is formed in a furnace by only thermal oxidation following formation of a trench; "—O—C" is where an oxide layer formed prior to deposition of a trench isolation material is made of CVD thermal oxide 308 and CVD oxide 310 (i.e., dual layer) following formation of a trench according to the present invention; and "-□-B" is where a trench isolation material is formed directly following the formation of a trench without thermal oxidation. As shown in the graph, a single layer of thermal oxide is similar to a dual layer comprising CVD thermal oxide and CVD oxide in terms of leakage currents. In an amount of a silicon substrate consumed, the dual layer is more conservative than the single layer (comparing FIG. 4 with FIG. 10). Therefore, the dual layer structure can reduce consumption of the substrate with maintaining the leakage current characteristic. This results in minimization of semiconductor defects caused by volume expansion.

It will be apparent to those skilled in the art that other modifications of this invention beyond those embodiments specifically described herein may be made without departing from the spirit of the invention. Accordingly, such modifications are considered within the scope of the invention as limited solely by the appended claims.

What is claimed is:
1. A method for forming a composite oxide layer having a first thickness in an integrated circuit device, the method comprising:
growing a thermal oxide layer having a second thickness thinner than the first thickness on a surface of a semiconductor substrate in a chemical vapor deposition (CVD) apparatus, wherein the surface of the semiconductor substrate comprises a bottom and a sidewall of a trench formed by etching the substrate to a predetermined depth;
forming a CVD oxide layer directly on the thermal oxide layer in the CVD apparatus after growing the thermal oxide layer, the CVD oxide layer having a third thickness substantially equal to a difference between the first thickness and the second thickness;
forming a nitride liner layer on the CVD oxide layer in the CVD apparatus; and
forming a trench filling layer on the nitride liner layer in the CVD apparatus.

2. The method of claim 1, wherein the thermal oxide layer is formed to a thickness of approximately 20 Å to 100 Å.

3. The method of claim 1, wherein the CVD oxide layer is formed of a material selected from the group consisting of silicon oxide, aluminum oxide, zirconium oxide, and tantalum oxide.

4. The method of claim 1, wherein growing the thermal oxide layer comprises using $O_2$, $N_2O$ or a combination thereof for an oxidizing ambient.

5. The method of claim 1, wherein growing the thermal oxide layer is carried out at a temperature of approximately 750° C. to 1000° C.

6. The method of claim 1, wherein growing the thermal oxide layer is carried out at a temperature of approximately 750° C. to 1000° C. and forming the CVD oxide layer is carried out at a temperature of approximately 700° C. to 850° C.

7. The method of claim 1,
wherein the thermal oxide layer is formed to a thickness of approximately 20 Å to 100 Å, and the CVD oxide layer is formed to a thickness of approximately 50 Å to 400 Å.

8. The method of claim 7, wherein the CVD oxide layer is formed of a material selected from the group consisting of silicon oxide, aluminum oxide, zirconium oxide, and tantalum oxide.

9. The method of claim 7, wherein growing the thermal oxide layer uses $O_2$, $N_2O$ or a combination thereof as a source gas at a temperature of approximately 750° C. to 1000° C., and forming a CVD oxide layer is carried out using $N_2O$ and $SiH_4$ as source gases at a temperature of approximately 700° C. to 850° C.

10. The method of claim 7, further comprising: forming the nitride liner layer to a thickness of approximately 30 Å to 100 Å and forming the trench filling layer to a thickness of approximately 3000 Å to 10000 Å.

11. A method of forming an integrated circuit device, comprising:
forming a trench in a single crystalline silicon substrate by etching;
forming a composite oxide layer of a double layer structure with a first thickness on a surface of the trench;
forming a nitride liner layer on the composite oxide layer, wherein forming the composite oxide layer comprises:
forming a thermal oxide layer having a second thickness of 20 Å to 100 Å on the trench;
forming a CVD conformal liner material layer directly on the thermal oxide layer, the CVD conformal liner material layer having a third thickness substantially equal to a difference between the first thickness and the second thickness wherein the thermal oxide layer, the CVD conformal liner material layer, and the nitride liner layer are formed in the same chemical vapor deposition (CVD) apparatus,
and wherein a thickness of 8.8 Å to 44 Å of the single crystalline silicon substrate is consumed during the forming of the thermal oxide layer.

12. The method of claim 11, wherein the CVD conformal liner material layer is formed to a thickness of 50 Å to 400 Å.

13. The method of claim 11, wherein the CVD conformal liner material layer is made of a material selected from the group consisting of silicon dioxide, aluminum trioxide, zirconium oxide, and tantalum pentoxide.

14. The method of claim 11, wherein the thermal oxide layer is formed using $O_2$, $N_2O$ or a combination thereof as a source gas at a temperature of approximately 750° C. to 1000° C., and the CVD conformal liner material layer is a high temperature oxide layer formed using $N_2O$ and $SiH_4$ as a source gas at a temperature of approximately 700° C. to 850° C.

15. The method of claim 14, further comprising: forming a trench isolation material on the nitride liner layer in the same CVD apparatus to fill the trench.

16. A method of forming an isolation trench, comprising:
   etching a single crystalline silicon substrate to form a trench therein;
   forming a composite oxide layer having a double layer structure with a first thickness on a surface of the trench; and
   forming a nitride liner layer on the composite oxide layer; and forming a trench isolation material layer on the nitride liner layer to fill the trench,
   wherein forming the composite oxide layer comprises:
   forming a thermal oxide layer having a second thickness of 20 Å to 100 Å on the trench;
   forming a CVD conformal liner material layer directly on the thermal oxide layer, the CVD conformal liner material layer having a third thickness substantially equal to a difference between the first thickness and the second thickness,
   wherein the thermal oxide layer, the CVD conformal liner material layer, and the nitride liner layer, and the trench isolation layer are formed in the same chemical vapor deposition (CVD) apparatus,
   and wherein a thickness of 8.8 Å to 44 Å of the single crystalline silicon substrate is consumed during the forming of the thermal oxide layer.

17. The method of claim 16, wherein the CVD conformal liner material layer is formed to a thickness of 50 Å to 400 Å.

18. The method of claim 16, wherein the thermal oxide layer is formed using $O_2$, $N_2O$ or a combination thereof as a source gas at a temperature of approximately 750° C. to 1000° C., and the CVD conformal liner material layer is a higher temperature oxide layer formed using $N_2O$ and $SiH_4$ as a source gas at a temperature of approximately 700° C. to 850° C.

19. The method of claim 16, wherein the CVD conformal liner material layer is made of a material selected from the group consisting of silicon oxide, aluminum oxide, zirconium oxide, and tantalum oxide.

* * * * *